(12) United States Patent
Park

(10) Patent No.: US 10,593,406 B2
(45) Date of Patent: Mar. 17, 2020

(54) SEMICONDUCTOR MEMORY DEVICE AND METHOD OF OPERATING THE SAME

(71) Applicant: SK hynix Inc., Icheon-si, Gyeonggi-do (KR)

(72) Inventor: Hyun Kyu Park, Cheonan-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 2 days.

(21) Appl. No.: 16/026,561

(22) Filed: Jul. 3, 2018

(65) Prior Publication Data

US 2019/0156894 A1    May 23, 2019

(30) Foreign Application Priority Data

Nov. 20, 2017    (KR) ......................... 10-2017-0154514

(51) Int. Cl.
| | | |
|---|---|---|
| G11C 7/00 | (2006.01) | |
| *G11C 16/10* | (2006.01) | |
| *G11C 16/24* | (2006.01) | |
| *G11C 16/08* | (2006.01) | |
| *G11C 16/34* | (2006.01) | |
| *G11C 16/22* | (2006.01) | |
| *G11C 16/20* | (2006.01) | |
| G11C 16/04 | (2006.01) | |
| G11C 16/26 | (2006.01) | |

(52) U.S. Cl.
CPC .............. *G11C 16/10* (2013.01); *G11C 16/08* (2013.01); *G11C 16/20* (2013.01); *G11C 16/22* (2013.01); *G11C 16/24* (2013.01); *G11C 16/3459* (2013.01); *G11C 16/0483* (2013.01); *G11C 16/26* (2013.01); *G11C 2216/14* (2013.01)

(58) Field of Classification Search
CPC ....... G11C 7/1078; G11C 7/22; G11C 7/1072; G11C 7/1096
USPC .................... 365/189.16, 89.14, 195, 189.14
See application file for complete search history.

(56) References Cited

U.S. PATENT DOCUMENTS

| | | | |
|---|---|---|---|
| 2015/0070989 A1* | 3/2015 | Funatsuki | G11C 11/5628 365/185.03 |
| 2016/0232975 A1* | 8/2016 | Oh | G11C 16/10 |

FOREIGN PATENT DOCUMENTS

| | | |
|---|---|---|
| KR | 101184866 B1 | 9/2012 |
| KR | 101211840 B1 | 12/2012 |
| KR | 101616097 B1 | 4/2016 |

* cited by examiner

*Primary Examiner* — Son T Dinh

(74) *Attorney, Agent, or Firm* — William Park & Associates Ltd.

(57) ABSTRACT

A semiconductor memory device may include a memory cell array, a peripheral circuit and a control logic. The memory cell array may include a plurality of memory blocks. The peripheral circuit may perform a program operation on a selected memory block among the memory blocks. The control logic may control the program operation of the peripheral circuit. The selected memory block may be coupled with a plurality of bit lines, and the bit lines may be grouped into a first bit line group and a second bit line group based on programming speeds of memory cells coupled to the bit lines that are grouped into the first and second bit line groups. During a blind program operation of the selected memory block, the control logic may control the peripheral circuit to apply different program permission voltages to bit lines of at least two bit line groups.

19 Claims, 15 Drawing Sheets

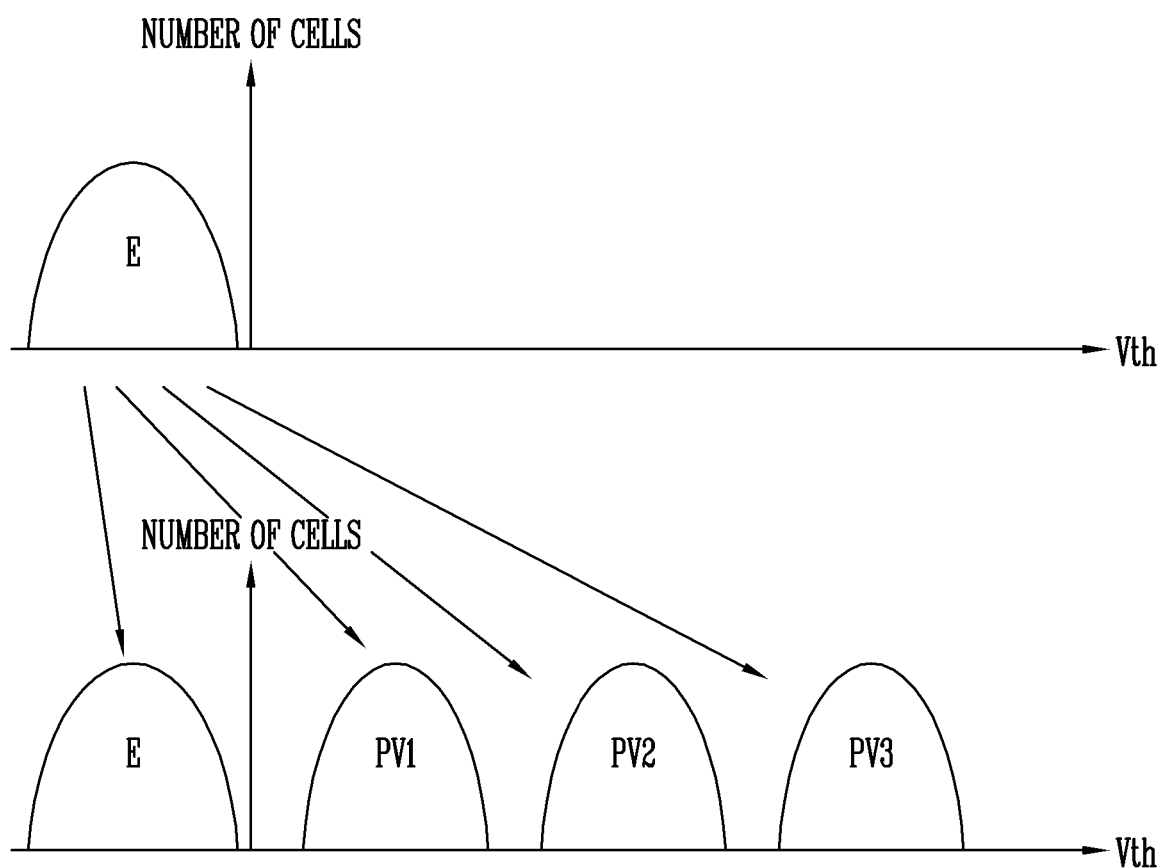

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2017-0154514 filed on Nov. 20, 2017, in the Korean Intellectual Property Office, the entire disclosure of which is incorporated herein by reference.

BACKGROUND

1. Technical Field

Various embodiments of the present disclosure generally relate to an electronic device, and more particularly, to a semiconductor memory device and a method of operating the semiconductor memory device.

2. Related Art

Generally, a memory device may have a two-dimensional structure in which strings are horizontally arranged on a semiconductor substrate, or a three-dimensional structure in which strings are vertically stacked on a semiconductor substrate. The three-dimensional memory device is devised to overcome a limitation in the degree of integration of the two-dimensional memory device and may include a plurality of memory cells which are vertically stacked on a semiconductor substrate.

SUMMARY

An embodiment of the present disclosure may provide for a semiconductor memory device including: a memory cell array including a plurality of memory blocks; a peripheral circuit configured to perform a program operation on a selected memory block among the plurality of memory blocks; and a control logic configured to control the program operation of the peripheral circuit. The selected memory block may be coupled with a plurality of bit lines. The plurality of bit lines may be grouped into a first bit line group and a second bit line group based on program speeds of each memory cell coupled to the plurality of bit lines that are grouped into the first bit line group and the second bit line group. During a blind program operation of the selected memory block, the control logic may control the peripheral circuit to apply, as a program permission voltage, a first bit line voltage to bit lines belonging to the first bit line group, and apply, as a program permission voltage, a second bit line voltage having a level different from a level of the first bit line voltage to bit lines belonging to the second bit line group.

An embodiment of the present disclosure may provide for a semiconductor memory device including: a memory cell array including at least one memory block coupled with a plurality of bit lines; a peripheral circuit configured to perform a program operation on a plurality of memory cells included in the memory block; and a control logic configured to control, during a blind program period, the peripheral circuit to apply different program permission voltages determined based on program speeds of the plurality of memory cells, to bit lines coupled to memory cells to be programmed among the plurality of memory cells.

An embodiment of the present disclosure may provide for a method of operating a semiconductor memory device, including: determining, based on positions of bit lines coupled to a memory block selected as a target to be programmed, bit lines disposed adjacent to an address decoder to a first bit line group; applying a first bit line voltage to a bit line coupled to memory cells to be programmed among the bit lines belonging to the first bit line group, applying a second bit line voltage to a bit line coupled to memory cells to be programmed among bit lines not belonging to the first bit line group, and applying a third bit line voltage to a bit line coupled to memory cells not to be programmed; and applying a program pulse to a selected word line of the memory block.

An embodiment of the present disclosure may provide for a method of operating a semiconductor memory device, including: providing a first deviation in program speeds between a plurality of memory cells included in a memory block; grouping a second plurality of memory cells from the plurality of memory cells to provide a second deviation in program speeds between memory cells in the second plurality of memory cells; grouping a third plurality of memory cells from the plurality of memory cells to provide a third deviation in program speeds between memory cells in the third plurality of memory cells; applying a first program permission voltage, during a blind program operation of a program operation of the memory block, as a first bit line voltage to bit lines coupled with the second plurality of memory cells; and applying a second program permission voltage, during the blind program operation of the program operation of the memory block, as a second bit line voltage to bit lines coupled with the third plurality of memory cells. A level of the first bit line voltage may be different from a level of the second bit line voltage.

BRIEF DESCRIPTION OF THE DRAWINGS

FIG. 7 is a diagram illustrating an example of the program operation of the semiconductor memory device in accordance with an embodiment of the present disclosure.

DETAILED DESCRIPTION

Figure 1:
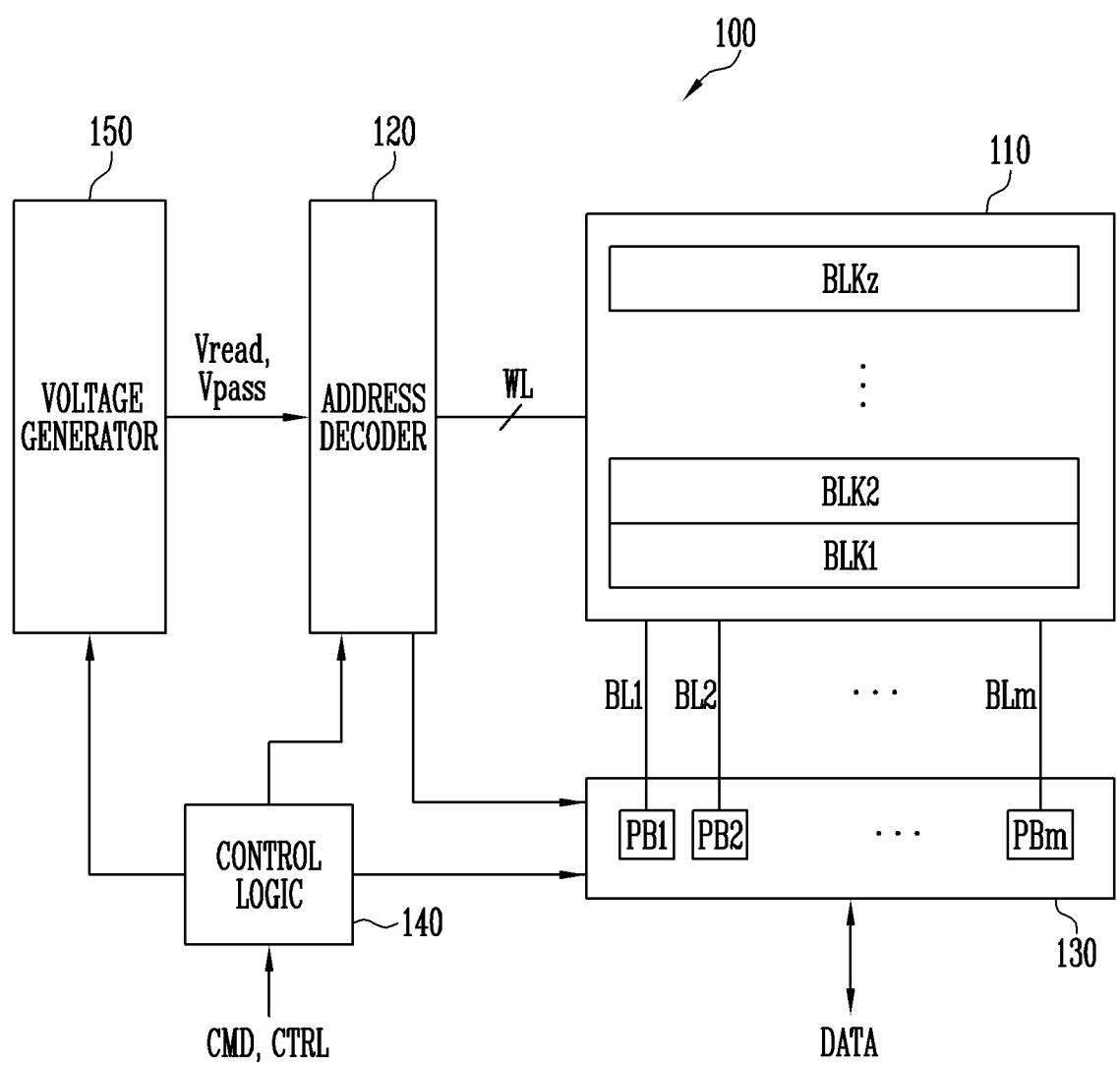
FIG. 1 is a block diagram illustrating a semiconductor memory device in accordance with an embodiment of the present disclosure.

Examples of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Various embodiments of the present disclosure may be directed to a semiconductor memory device having an improved operating speed.

Various embodiments of the present disclosure may be directed to a method of operating a semiconductor memory device having an improved operating speed.

FIG. 1 is a block diagram illustrating a semiconductor memory device 100 in accordance with an embodiment of the present disclosure.

Referring to FIG. 1, the semiconductor memory device 100 includes a memory cell array 110, an address decoder 120, a read/write circuit 130, a control logic 140, and a voltage generator 150.

The memory cell array 110 includes a plurality of memory blocks BLK1 to BLKz. The memory blocks BLK1 to BLKz may be coupled to the address decoder 120 through word lines WL. The memory blocks BLK1 to BLKz are coupled to the read/write circuit 130 through bit lines BL1 to BLm. Each of the memory blocks BLK1 to BLKz includes a plurality of memory cells. In an embodiment, the plurality of memory cells may be nonvolatile memory cells and be formed of nonvolatile memory cells having a vertical channel structure. The memory cell array 110 may be formed of a memory cell array having a two-dimensional structure. In an embodiment, the memory cell array 110 may be formed of a memory cell array having a three-dimensional structure. Each of the memory cells included in the memory cell array may store at least one bit of data. In an embodiment, each of the memory cells included in the memory cell array 110 may be a single-level cell (SLC), which stores 1-bit data. In an embodiment, each of the memory cells included in the memory cell array 110 may be a multi-level cell (MLC), which stores 2-bit data. In an embodiment, each of the memory cells included in the memory cell array 110 may be a triple-level cell, which stores 3-bit data. In an embodiment, each of the memory cells included in the memory cell array 110 may be a quad-level cell, which stores 4-bit data. In various embodiments, the memory cell array 110 may include a plurality of memory cells each of which stores 5 or more bits of data.

The address decoder 120, the read/write circuit 130, the control logic 140, and the voltage generator 150 are operated as peripheral circuits for driving the memory cell array 110. The address decoder 120 is coupled to the memory cell array 110 through the word lines WL. The address decoder 120 may operate under control of the control logic 140. The address decoder 120 may receive addresses through an input/output buffer (not shown) provided in the semiconductor memory device 100.

The address decoder 120 may decode a block address among the received addresses. The address decoder 120 selects at least one memory block based on the decoded block address. When a read voltage application operation is performed during a read operation, the address decoder 120 may apply a read voltage Vread generated from the voltage generator 150, to a selected word line of a selected memory block and apply a pass voltage Vpass to the other unselected word lines. During a program verify operation, the address decoder 120 may apply a verify voltage generated from the voltage generator 150, to a selected word line of a selected memory block, and apply a pass voltage Vpass to the other unselected word lines.

The address decoder 120 may decode a column address among the received addresses. The address decoder 120 may transmit the decoded column address to the read/write circuit 130.

The read or program operation of the semiconductor memory device 100 is performed on a page basis. Addresses received in a request for a read or program operation may include a block address, a row address and a column address. The address decoder 120 may select one memory block and one word line in response to the block address and the row address. The column address may be decoded by the address decoder 120 and provided to the read/write circuit 130.

The address decoder 120 may include a block decoder, a row decoder, a column decoder, an address buffer, etc.

The read/write circuit 130 includes a plurality of page buffers PB1 to PBm. The read/write circuit 130 may be operated as a read circuit during a read operation of the memory cell array 110 and as a write circuit during a write operation. The page buffers PB1 to PBm are coupled to the memory cell array 110 through the bit lines BL1 to BLm. During a read operation or a program verify operation, to sense threshold voltages of the memory cells, the page buffers PB1 to PBm may continuously supply sensing current to the bit lines coupled to the memory cells, and each page buffer may sense, through a sensing node, a change in the amount of flowing current depending on a program state of a corresponding memory cell and latch it as sensing data. The read/write circuit 130 is operated in response to page buffer control signals output from the control logic 140.

During a read operation, the read/write circuit 130 may sense data of the memory cells and temporarily store read-out data, and then output data DATA to the input/output buffer (not shown) of the semiconductor memory device 100. In an embodiment, the read/write circuit 130 may include a column select circuit or the like as well as the page buffers (or page registers).

The control logic 140 is coupled to the address decoder 120, the read/write circuit 130, and the voltage generator 150. The control logic 140 may receive a command CMD and a control signal CTRL through the input/output buffer (not shown) of the semiconductor memory device 100. The control logic 140 may control the overall operation of the semiconductor memory device 100 in response to the control signal CTRL. The control logic 140 may output a control signal for controlling the sensing node precharge potential levels of the plurality of page buffers PB1 to PBm. The control logic 140 may control the read/write circuit 130 to perform a read operation of the memory cell array 110.

In the semiconductor memory device 100 and an operating method thereof in accordance with embodiments of the present disclosure, depending on the position of each memory cell, a program permission voltage to be applied to a corresponding bit line is adjusted. Hence, a deviation in program speed between memory cells may be reduced. Thereby, the program speed of the semiconductor memory device 100 may be enhanced. Details of an operation of adjusting the program permission voltage to be applied to the bit line according to the semiconductor memory device 100 and an operating method thereof in accordance with embodiments of the present disclosure will be described with reference to FIGS. 6 to 16.

The voltage generator 150 may generate a read voltage Vread and a pass voltage Vpass during a read operation in response to a control signal output from the control logic 140. The voltage generator 150 may be included so as to generate a plurality of voltages having various levels, a plurality of pumping capacitors configured to receive an internal source voltage, and to generate a plurality of voltages by selectively enabling the plurality of pumping capacitors under control of the control logic 140.

Figure 2:
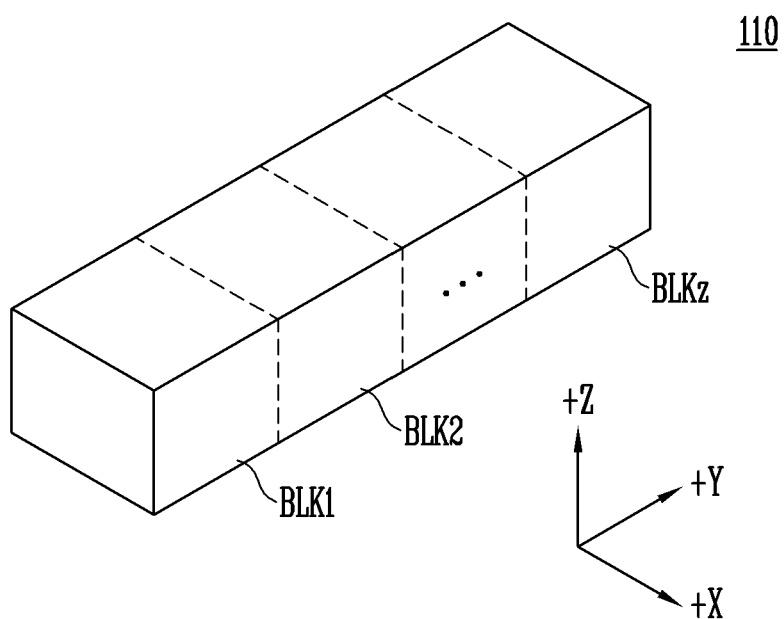
FIG. 2 is a diagram illustrating an example of a memory cell array of FIG. 1.

FIG. 2 is a diagram illustrating an example of the memory cell array 110 of FIG. 1.

Referring to FIG. 2, the memory cell array 110 includes the plurality of memory blocks BLK1 to BLKz. Each memory block may have a three-dimensional structure. Each memory block may include a plurality of memory cells stacked on a substrate. The memory cells are arranged in a +X direction, a +Y direction, and a +Z direction. The structure of each memory block will be described with reference to FIGS. 3 and 4.

Figure 3:
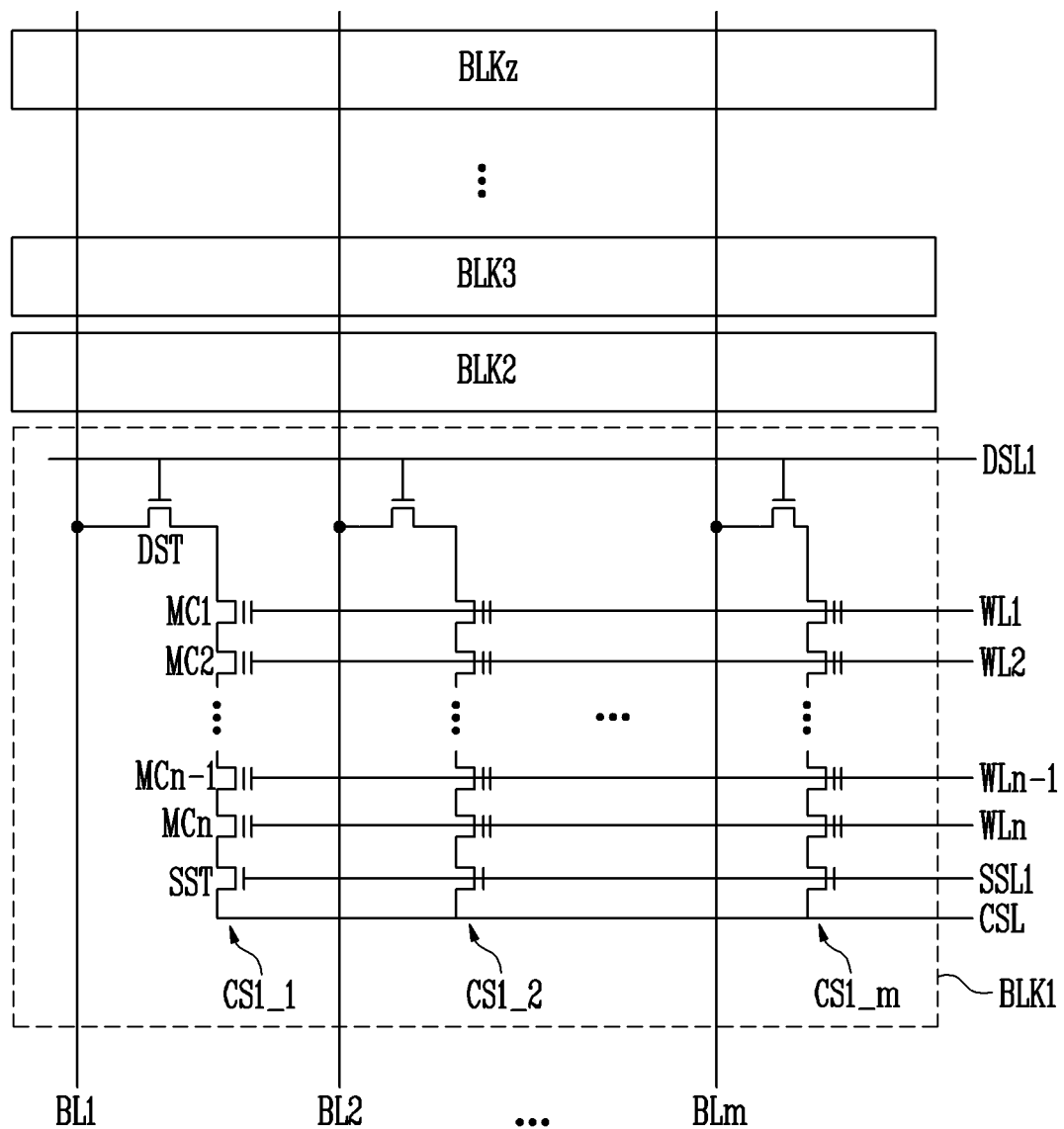
FIG. 3 is a diagram illustrating an example of the memory cell array of FIG. 1.

FIG. 3 is a diagram illustrating an example of the memory cell array 110 of FIG. 1.

Referring to FIG. 3, first to z-th memory blocks BLK1 to BLKz included in a memory cell array 110_1 are coupled in common to first to m-th bit lines BL1 to BLm. In FIG. 3, for the sake of explanation, elements of only the first memory block BLK1 among the plurality of memory blocks BLK1 to BLKz are illustrated, and illustration of elements of each of the other memory blocks BLK2 to BLKz is omitted. It will be understood that each of the memory blocks BLK2 to BLKz has the same configuration as that of the first memory block BLK1.

The memory block BLK1 includes a plurality of cell strings CS1_1 to CS1_m. The first to m-th cell strings CS1_1 to CS1_m are respectively coupled to the first to m-th bit lines BL1 to BLm.

Each of the first to m-th cell strings CS1_1 to CS1_m includes a drain select transistor DST, a plurality of memory cells MC1 to MCn coupled in series to each other, and a source select transistor SST. The drain select transistor DST is coupled to a drain select line DSL1. The first to n-th memory cells MC1 to MCn are respectively coupled to first to n-th word lines WL1 to WLn. The source select transistor SST is coupled to a source select line SSL1. A drain of the drain select transistor DST is coupled to the corresponding bit line. The drain select transistors DST of the first to m-th cell strings CS1_1 to CS1_m are respectively coupled to the first to m-th bit lines BL1 to BLm. A source of the source select transistor SST is coupled to a common source line CSL. In an embodiment, the common source line CSL may be coupled in common to the first to z-th memory blocks BLK1 to BLKz.

The drain select line DSL1, the first to n-th word lines WL1 to WLn, and the source select line SSL1 are controlled by the address decoder 120. The common source line CSL is controlled by the control logic 140. The first to m-th bit lines BL1 to BLm are controlled by the read/write circuit 123.

As shown in FIG. 3, the memory cell array 110 of the semiconductor memory device 100 in accordance with an embodiment of the present disclosure may be formed of the memory cell array 110_1 having a two-dimensional structure. However, in various embodiments, the memory cell array 110 of the semiconductor memory device 100 may be formed of a memory cell array having a three-dimensional structure. The memory cell array having a three-dimensional structure will be described herein below with reference to FIGS. 4 and 5.

Figure 4:
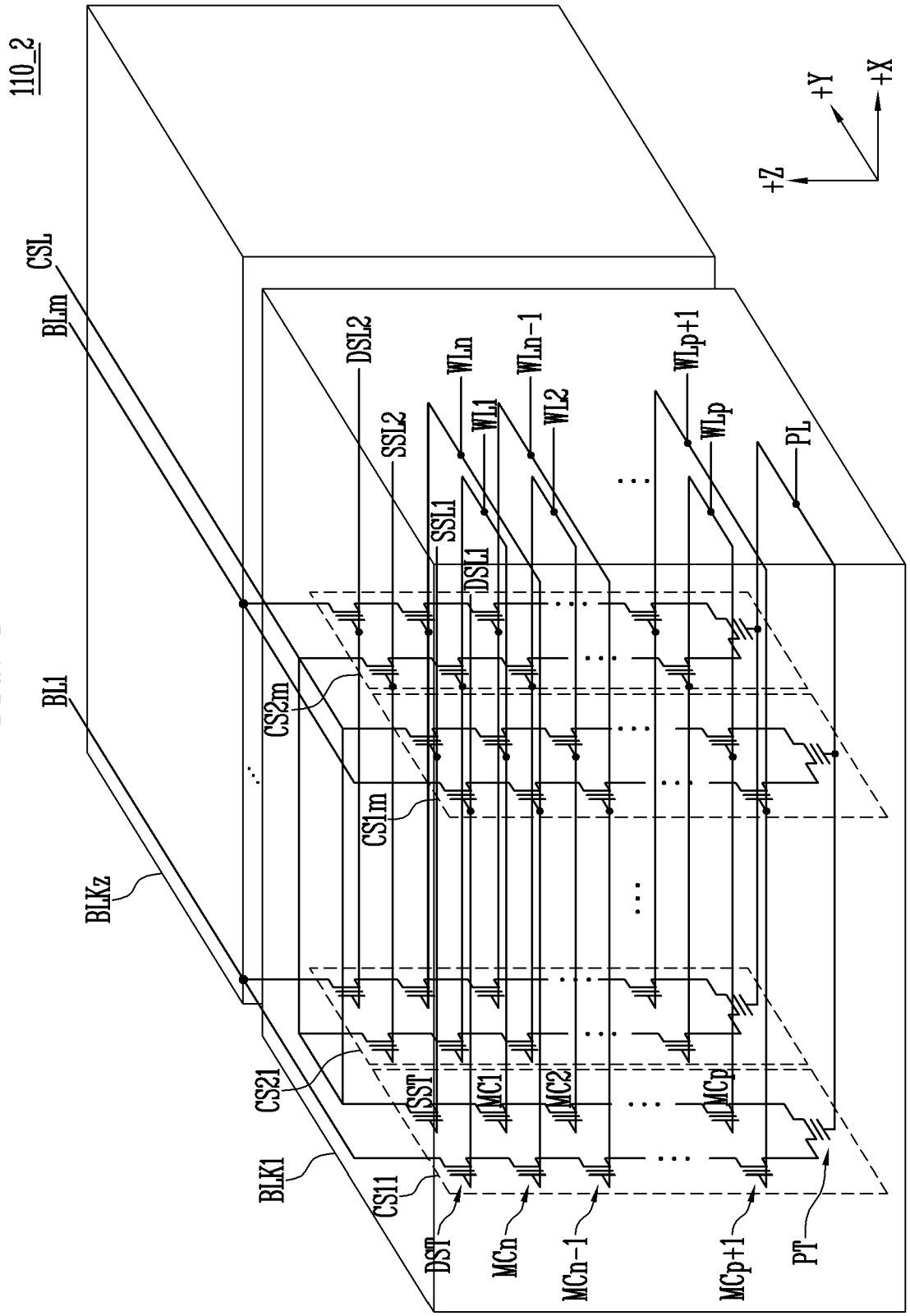
FIG. 4 is a diagram illustrating an example of the memory cell array of FIG. 1.

FIG. 4 is a diagram illustrating an example (110_2) of the memory cell array 110 of FIG. 1.

Referring to FIG. 4, a memory cell array 110_2 includes a plurality of memory blocks BLK1 to BLKz. In FIG. 4, for the sake of description, the internal configuration of the first memory block BLK1 is illustrated, and the internal configuration of each of the other memory blocks BLK2 to BLKz is omitted. It will be understood that each of the second to z-th memory blocks BLK2 to BLKz has the same configuration as that of the first memory block BLK1.

Referring to FIG. 4, the first memory block BLK1 includes a plurality of cell strings CS11 to CS1m and CS21 to CS2m. In an embodiment, each of the cell strings CS11 to CS1m and CS21 to CS2m may be formed in a 'U' shape. In the first memory block BLK1, m cell strings are arranged in a row direction (i.e. a positive (+) X direction). In FIG. 4, two cell strings are illustrated as being arranged in a column direction (i.e., a positive (+) Y direction). However, this illustration is made for convenience of description, and it will be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have structures similar to each other. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 4, source select transistors of the cell strings CS11 to CS1m in a first row are coupled to a first source select line SSL1. Source select transistors of the cell strings CS21 to CS2m in a second row are coupled to a second source select line SSL2.

In an embodiment, source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a direction opposite to a positive (+) Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

A gate of the pipe transistor PT of each cell string is coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

Cell strings arranged in the column direction may be coupled to bit lines extending in the column direction. In FIG. 4, cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. Cell strings arranged in the direction of a single row may be selected by selecting any one of the drain select lines DSL1 and DSL2. One page may be selected from among the selected cell strings by selecting any one of the word lines WL1 to WLn.

Figure 5:
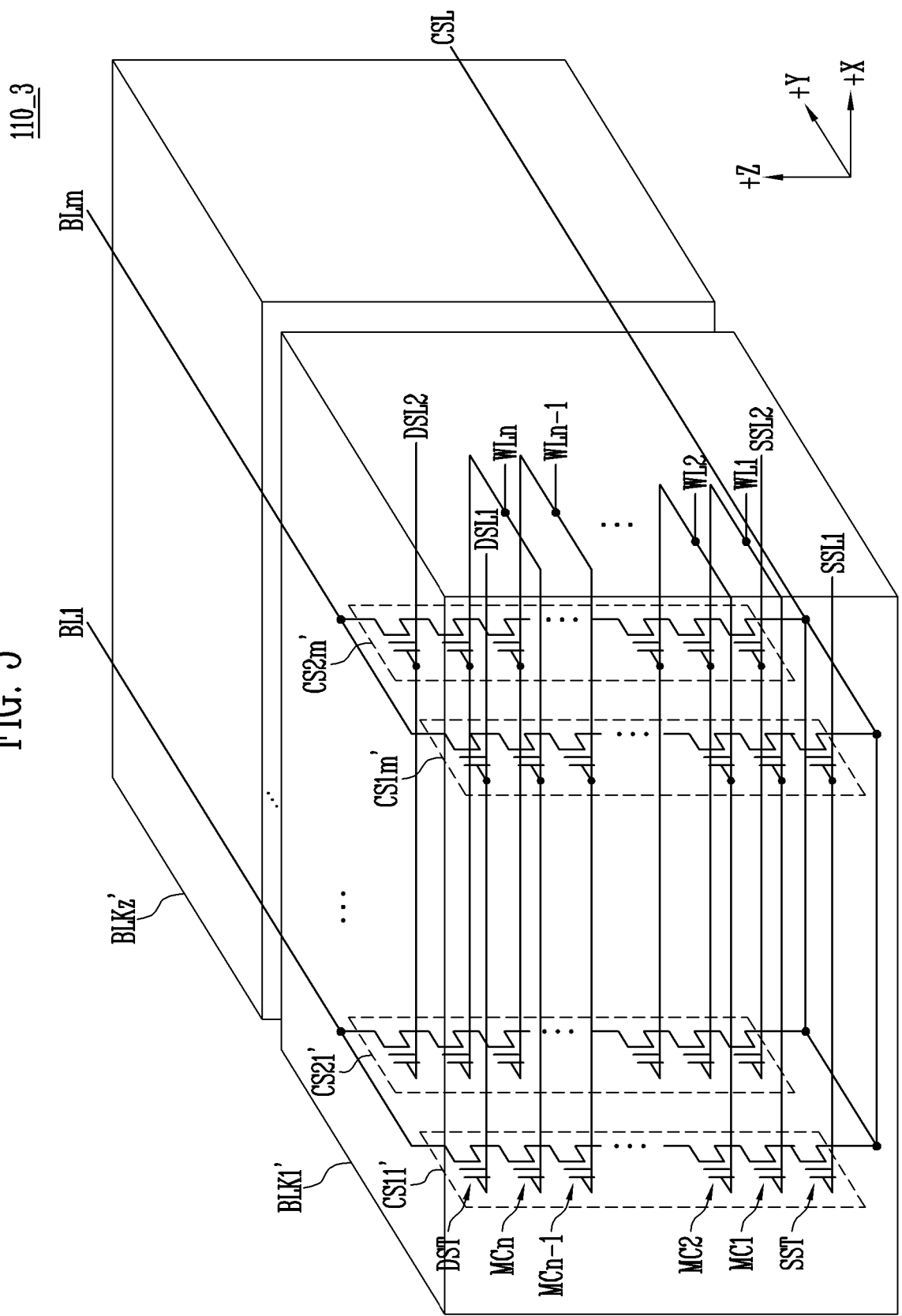
FIG. 5 is a diagram illustrating an example of the memory cell array of FIG. 1.

FIG. 5 is a diagram illustrating an example (110_3) of the memory cell array 110 of FIG. 1.

Referring to FIG. 5, a memory cell array 110_3 includes a plurality of memory blocks BLK1' to BLKz'. In FIG. 5, for the sake of description, the internal configuration of the first memory block BLK1' is illustrated, and the internal configuration of each of the other memory blocks BLK2' to BLKz' is omitted. It will be understood that each of the second to z-th memory blocks BLK2' to BLKz' has the same configuration as that of the first memory block BLK1'.

The first memory block BLK1' includes a plurality of cell strings CS11' to CS1m' and CS21' to CS2m'. Each of the cell strings CS11' to CS1m' and CS21' to CS2m' extends in a positive (+) Z direction. In the first memory block BLK1', m cell strings are arranged in the +X direction. In FIG. 4, two cell strings are illustrated as being arranged in a +Y direction. However, this illustration is made for convenience of description, and it will be understood that three or more cell strings may be arranged in the column direction.

Each of the cell strings CS11' to CS1m' and CS21' to CS2m' includes at least one source select transistor SST, first to n-th memory cells MC1 to MCn, and at least one drain select transistor DST.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1m' arranged in a first row may be coupled to a first source select line SSL1. Source select transistors of the cell strings CS21' to CS2m' arranged in a second row may be coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction. Drain select transistors of the cell strings CS11' to CS1m' in the first row are coupled to a first drain select line DSL1. Drain select transistors of the cell strings CS21' to CS2m' in the second row may be coupled to a second drain select line DSL2.

As a result, the memory block BLK1' of FIG. 5 has an equivalent circuit similar to that of the memory block BLK1 of FIG. 4 except that a pipe transistor PT is excluded from each cell string.

Figure 6:
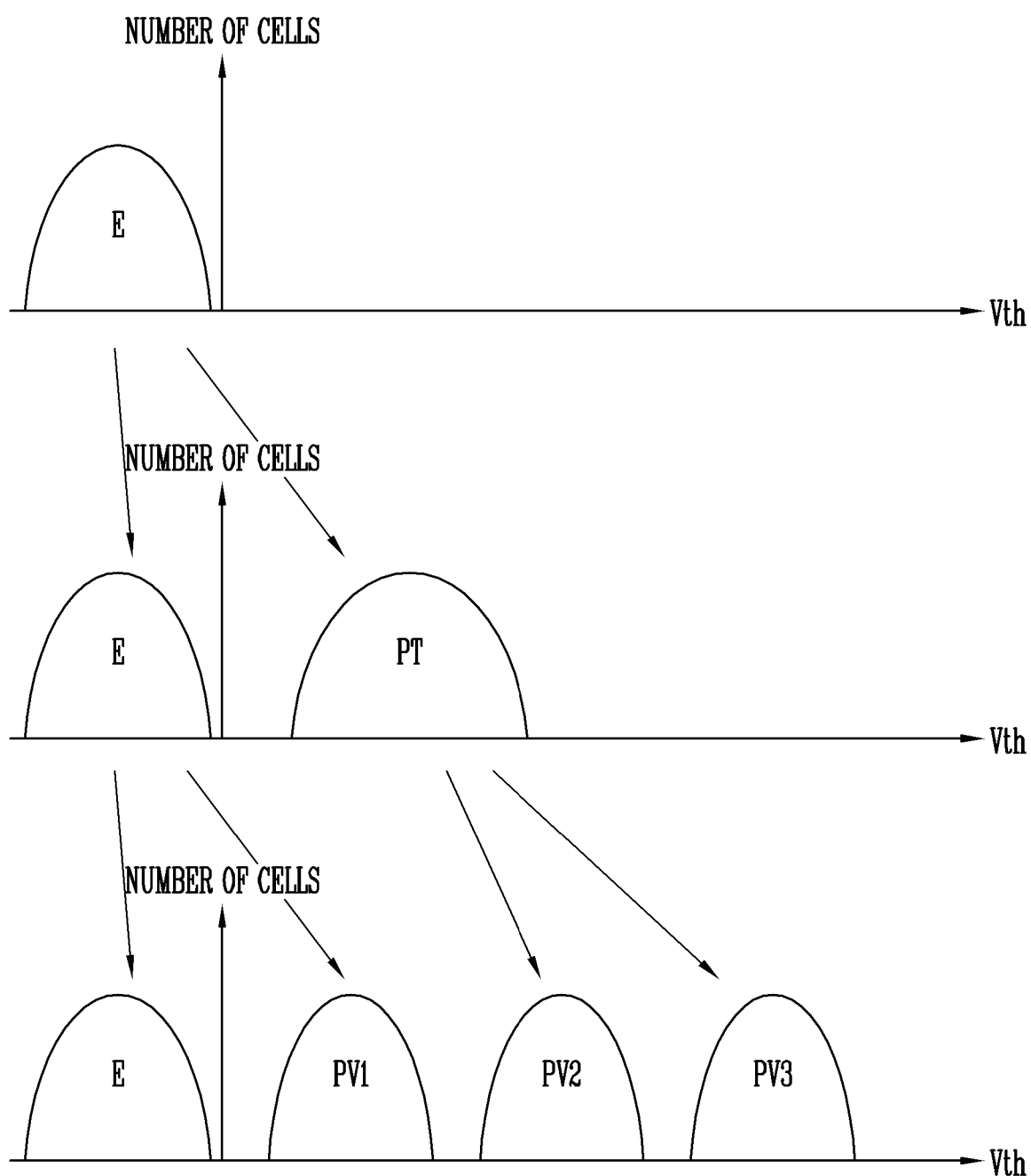
FIG. 6 is a diagram illustrating an example of a program operation of the semiconductor memory device in accordance with an embodiment of the present disclosure.

FIG. 6 is a diagram illustrating an example of a program operation of the semiconductor memory device in accordance with an embodiment of the present disclosure. Referring to FIG. 6, there is illustrated a program operation of multi-level cells (MCLS) which store 2-bit data. In detail, FIG. 6 is a diagram illustrating threshold voltage distributions of memory cells according to a least significant bit (LSB) page program and a most significant bit (MSB) page program.

Referring to FIG. 6, the memory cells are maintained in an erase state E before being programmed. Thereafter, as a program operation is performed, the memory cells which store 2-bit data have the following two states. The memory cells have the erase state E or a temporary program state PT by an LSB program operation. Subsequently, the memory cells have the erase state E, a first program state PV1, a second program state PV2, and a third program state PV3 by an MSB program operation.

FIG. 7 is a diagram illustrating an example of the program operation of the semiconductor memory device in accordance with an embodiment of the present disclosure. In the same manner as the example of FIG. 6, FIG. 7 illustrates a program operation of multi-level cells which store 2-bit data. Unlike the example of FIG. 6, referring to FIG. 7, threshold voltages of the memory cells are shifted from an erase state E to respective program states PV1, PV2, and PV3 without performing an operation of programming the memory cells to a temporary program state PT. This program method may be referred to as "one-shot program".

In the case of the one-shot program, a blind program scheme in which a verify operation is omitted at an initial stage of a program operation may be used. The reason for this is because of the fact that, because shift widths of the threshold voltages of memory cells to be programmed are relatively small at the initial stage of the program operation, the overall program speed may be enhanced by omitting an unnecessary verify operation. The blind program scheme will be described below with reference to FIGS. 8A to 9B.

Figure 8A:
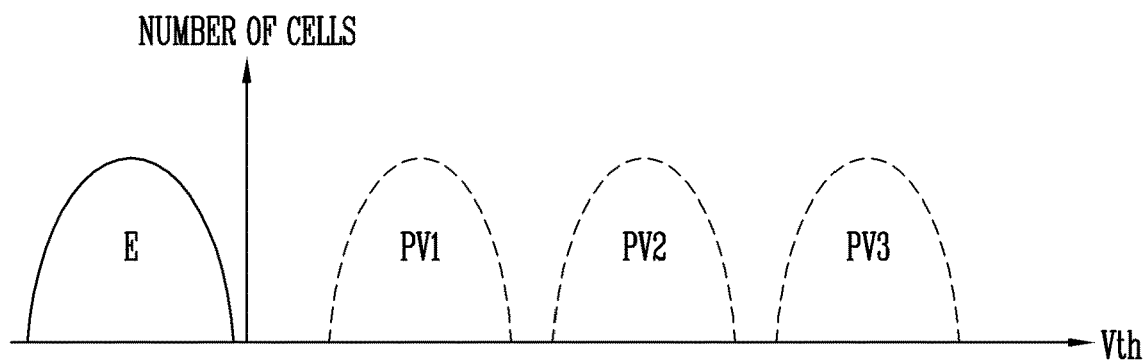
FIGS. 8A, 8B, and 8C are diagrams illustrating threshold voltage distributions during a blind program operation in accordance with an embodiment of the present disclosure.
Figure 8B:
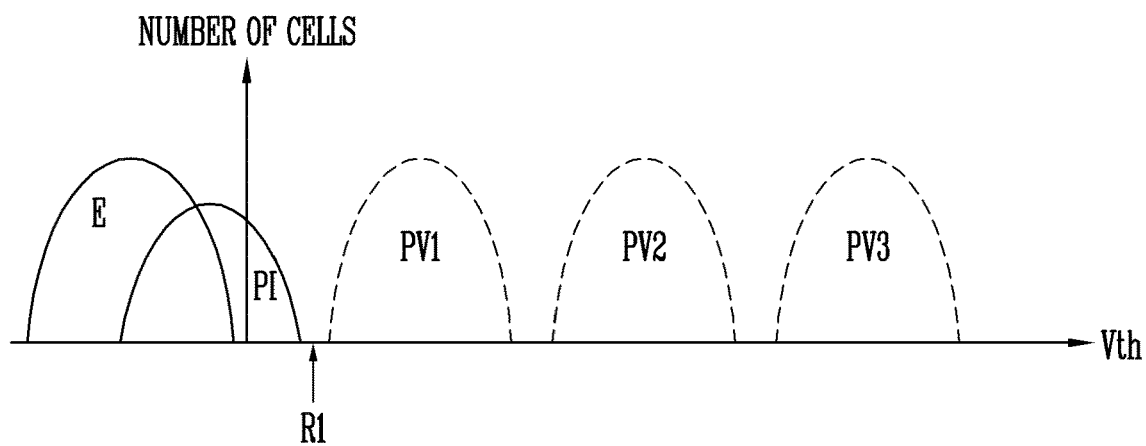
Figure 8C:
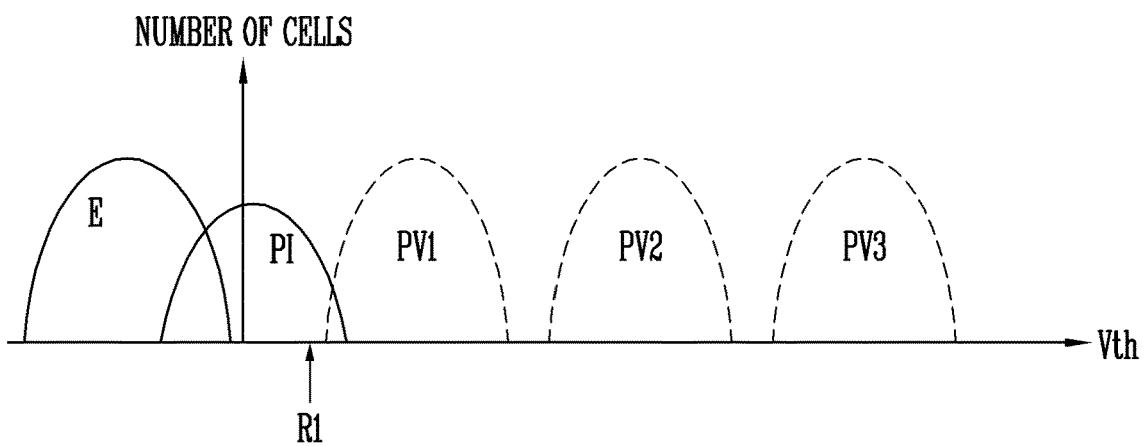
Figure 9A:
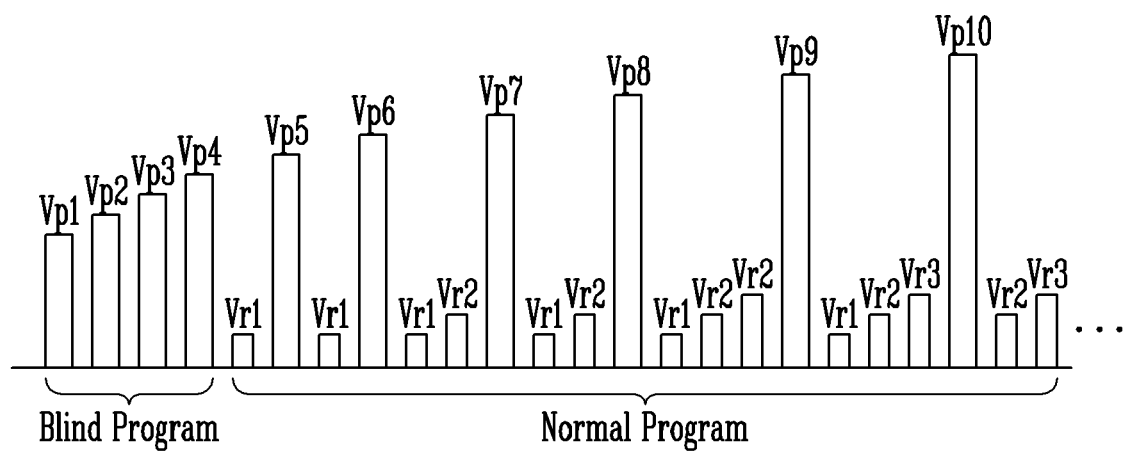
FIGS. 9A and 9B are diagrams illustrating the blind program operation in accordance with an embodiment of the present disclosure.
Figure 9B:
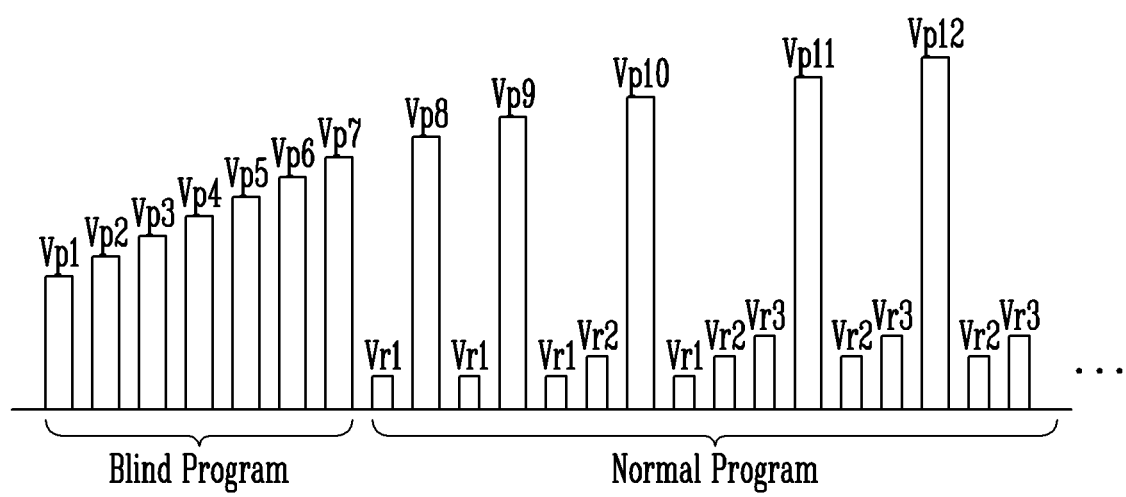

FIGS. 8A, 8B, and 8C are diagrams illustrating threshold voltage distributions during the blind program operation in accordance with an embodiment of the present disclosure. FIGS. 9A and 9B are diagrams illustrating the blind program operation in accordance with an embodiment of the present disclosure. Hereinafter, the blind program operation will be described with reference to FIGS. 8A to 9B.

Referring to FIG. 8A, there are illustrated threshold voltage distributions of memory cells before the program operation starts. The memory cells that are in an erase state E may be programmed to first to third program states PV1, PV2, and PV3 after the program operation has been completed. In FIG. 8A, the first to third program states PV1, PV2, and PV3 are indicated by broken lines because there is no memory cell programmed to the first, second or third program state PV1, PV2, or PV3.

Referring to FIG. 8B, it may be understood that, as the program operation starts, a program pulse is applied to memory cells to be programmed, so that the threshold voltage distributions of the memory cells are shifted. In other words, other than memory cells to be maintained in the erase state E among the memory cells, the threshold voltage distributions of memory cells to be programmed to the first to third program states PV1, PV2, and PV3 are shifted. In this case, a program inhibit voltage is applied to a bit line coupled to the memory cells to be maintained in the erase state E. A program permission voltage is applied to a bit line coupled to the memory cells to be programmed to the first to third program states PV1, PV2, and PV3. In this state, when a program pulse is applied to a selected word line, the threshold voltages of the memory cells to be maintained in the erase sate E remain unchanged, and the threshold voltages of the memory cells to be programmed to the first to third program states PV1, PV2, and PV3 are shifted. As shown in FIG. 8B, at the initial stage of the program operation, the threshold voltages PT of the memory cells to be programmed are lower than a first voltage R1. Under conditions shown in FIG. 8B, the threshold voltage of any memory cell has not reached the first program state PV1, so that the program pulse may be applied without performing a verify operation.

Referring to FIG. 8C, there is illustrated the case where the threshold voltages of some of the memory cells to be programmed exceed the first voltage R1 and reach the first program state PV1. Since the memory cells the threshold voltages of which reach the first program state PV1 are present, memory cells the threshold voltages of which have reached a target program state are distinguished from the other memory cells by performing the verify operation, and the threshold voltages of the corresponding memory cells are selectively changed.

Referring to FIG. 9A, there is illustrated a blind program operation when a memory cell the program speed of which is relatively high is present among the memory cells. Referring to FIG. 9B, there is illustrated a blind program operation when there is no memory cell the program speed of which is relatively high among the memory cells. Referring to FIG. 9A, during a blind program period, first to fourth program pulses Vp1 to Vp4 are applied to a selected word line. In an example of FIG. 9A, because there is a memory cell the program speed of which is relatively high, the corresponding memory cell reaches the first program state PV1 by applying program pulses to the selected word line only four times. Thereby, the blind program operation is terminated, and a normal program operation starts, so that first to verify operations using first to third verify voltages Vr1, Vr2, and Vr3 are performed.

Referring to FIG. 9B, during a blind program period, first to seventh program pulses Vp1 to Vp7 are applied to a selected word line. In an example of FIG. 9B, because there is no memory cell the program speed of which is relatively high, a memory cell that reaches the first program state PV1 becomes present after program pulses have been applied seven times. Thereby, the blind program operation is terminated, and a normal program operation starts, so that verify operations using first to third verify voltages Vr1, Vr2, and Vr3 are performed.

Referring to FIGS. 9A and 9B, it may be understood that, if the blind program operation is maintained for a long time at the initial stage of the program operation, the number of verify operations is reduced, whereby the program speed may be enhanced. In other words, in the case of FIG. 9A, the verify operations are omitted while the first to fourth program pulses Vp1 to Vp4 are applied, but in the case of FIG. 9B, the verify operations may be omitted while the first to seventh program pulses Vp1 to Vp7 are applied. Therefore, so as to enhance the program speed, the number of times of application of program pulses during the blind program operation must be increased. As described above, in the case where a memory cell the program speed of which is relatively high is present because there is a large deviation in program speed between the memory cells, the blind program operation is terminated early, as shown in FIG. 9A. On the other hand, in the case where there is no memory cell the program speed of which is relatively high because there is a small deviation in program speed between the memory cells, the blind program operation is maintained for a long time, as shown in FIG. 9B, whereby the overall program speed may be enhanced.

In the semiconductor memory device 100 according to an embodiment of the present disclosure, depending on the position of a memory cell, a program permission voltage to be applied to the corresponding bit line may be adjusted, whereby the deviation in program speed between the memory cells may be reduced. Consequently, as shown in FIG. 9B, the time for which the blind program operation is performed may be increased, so that the overall program speed may be enhanced.

Although the blind program operation of the multi-level cells has been described with reference to FIGS. 8A to 9B, it will be understood that the blind program operation may also be performed on triple-level cells (TLCs) which store 3-bit data or memory cells which store 4- or more-bit data in a manner similar to that of the multi-level cells.

Figure 10:
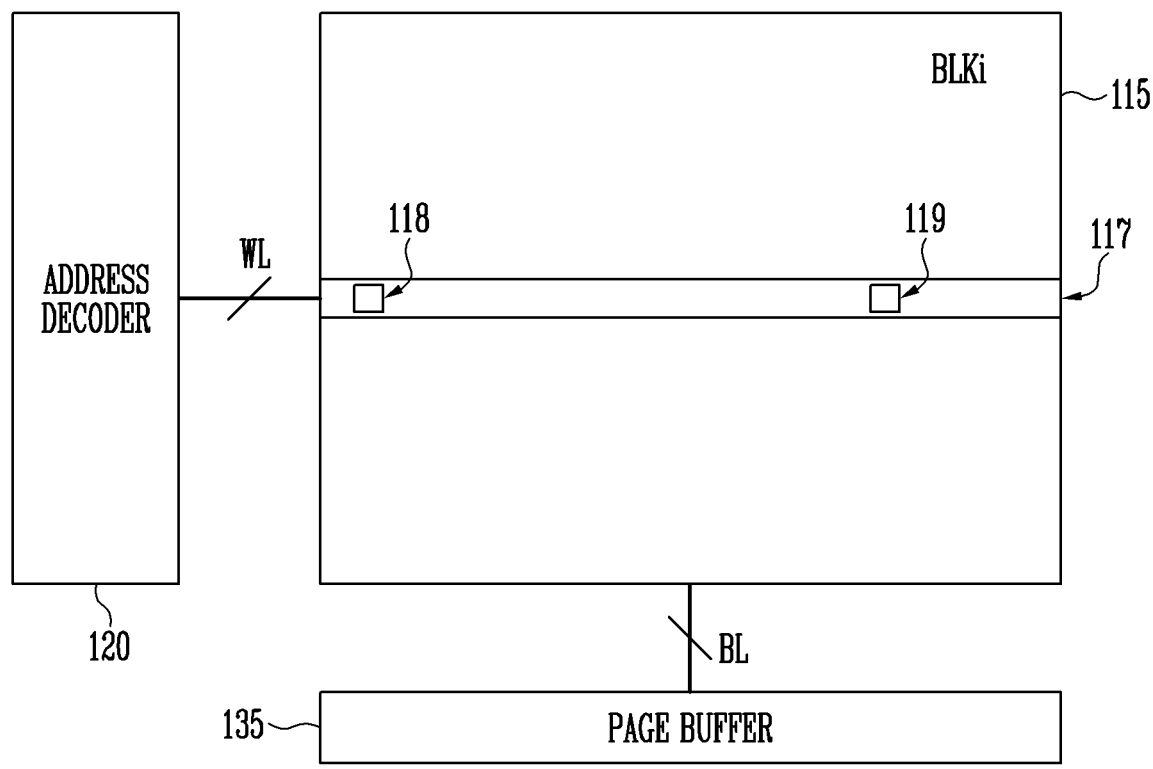
FIG. 10 is a block diagram illustrating a program speed depending on the position of a memory cell in accordance with an embodiment of the present disclosure.

FIG. 10 is a block diagram illustrating a program speed depending on the position of a memory cell in accordance with an embodiment of the present disclosure. Referring to FIG. 10, there are illustrated a memory block (BLKi) 115, an address decoder 120, and a page buffer 135 which are included in the memory cell array 110 among the components of the semiconductor memory device 100 shown in FIG. 1. As described above, the memory block 115 is coupled to the address decoder 120 through the word line WL and coupled to the page buffer 135 through the bit line BL. The page buffer 135 shown in FIG. 10 may be any one of the page buffers PB1 to PBm shown in FIG. 1.

The memory block 115 may include a plurality of physical pages. A physical page 117 selected as a target to be programmed among the plurality of physical pages may include a plurality of memory cells. The memory cells included in the physical page 117 are coupled to a single word line. The memory cells are coupled to respective different bit lines.

There may be various factors affecting the program speed of an individual memory cell. The program speed of each of the memory cells included in the physical page 117 may be changed depending on the position of the memory cell that is one of the factors. For example, the program speed of a memory cell 118 disposed adjacent to the address decoder 120 may be higher than that of a memory cell 119 disposed distant from the address decoder 120. Therefore, if the program speed of the memory cell 118 disposed adjacent to the address decoder 120 is reduced, the deviation in program speed between the memory cells included in the physical page 117 may be reduced. Consequently, as shown in FIG. 9B, the time for which the blind program operation is performed may be increased, so that the number of verify operations may be relatively reduced, whereby the overall program speed may be enhanced. In the semiconductor memory device and the operating method thereof in accordance with an embodiment of the present disclosure, the bit lines coupled with the memory cells disposed in the memory block are divided into a plurality of groups, and a relatively high program permission voltage is applied to bit lines that are disposed adjacent to the address decoder so as to reduce the program speed of the corresponding memory cells. Thereby, the overall program speed may be increased.

Figure 11:
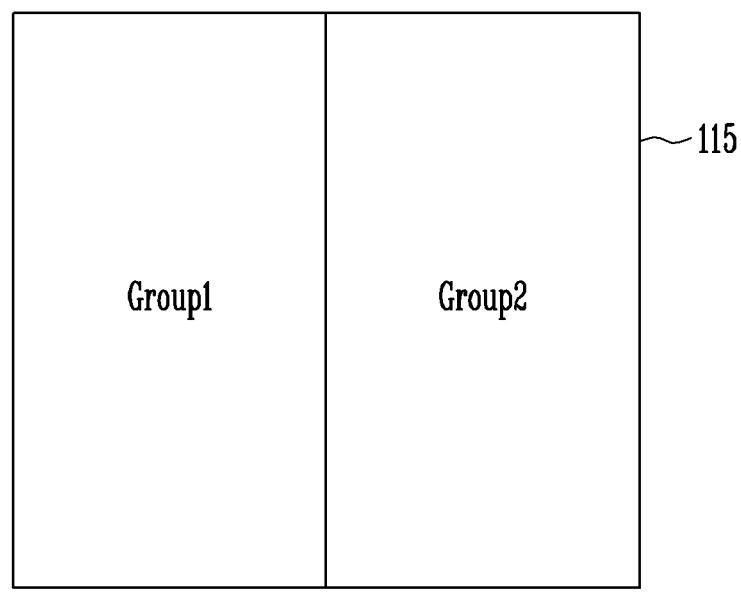
FIG. 11 is a schematic diagram illustrating a memory block to which two groups of bit lines are coupled, in accordance with an embodiment of the present disclosure.

FIG. 11 is a schematic diagram illustrating a memory block 115 to which two groups of bit lines are coupled. Referring to FIG. 11, the bit lines coupled to the memory block 115 may be divided into a first group Group1 and a second group Group2 depending on the positions of the bit lines. Referring also to FIG. 10, bit lines included in the first group Group1 may be bit lines disposed relatively adjacent to the address decoder 120. Bit lines included in the second group Group2 may be bit lines disposed relatively distant from the address decoder 120. In the semiconductor memory device 100 and the operating method thereof in accordance with the present disclosure, a program permission voltage to be applied to the bit lines belonging to the first group Group1 differs from a program permission voltage to be applied to the bit lines belonging to the second group Group2. In detail, the program permission voltage to be applied to the bit lines belonging to the first group Group1 is higher than the program permission voltage to be applied to the bit lines belonging to the second group Group2. Thereby, the program speed of the memory cells that are coupled to the bit lines belonging to the first group Group1 and are to be programmed may be reduced. Therefore, the deviation in program speed between the memory cells included in the physical page 117 is reduced, whereby the number of verify operations in the normal program operation may be reduced. Consequently, the overall program speed may be enhanced.

Figure 12:
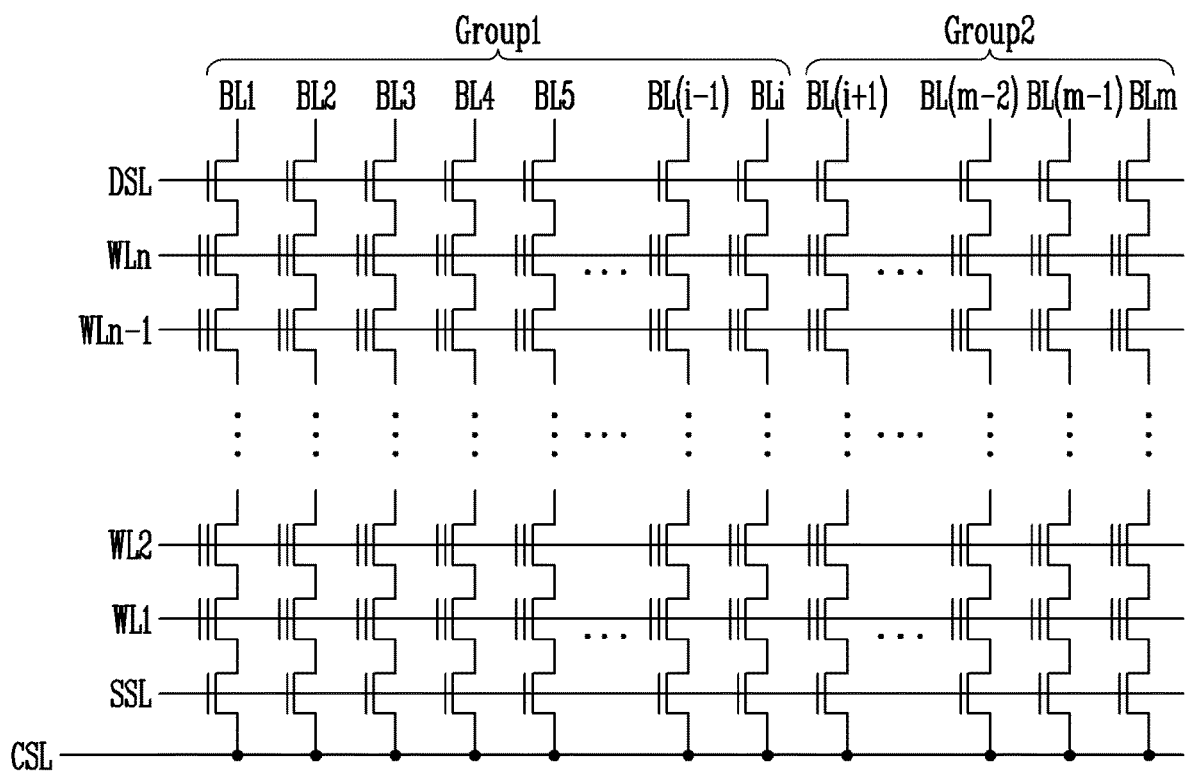
FIG. 12 is a circuit diagram illustrating in detail a first group and a second group shown in FIG. 11.

FIG. 12 is a circuit diagram illustrating the first group Group1 and the second group Group2 shown in FIG. 11.

FIG. 12 illustrates, for example, the groups of bit lines coupled to the memory block 115. As described above, the memory block 115 includes a plurality of cell strings coupled to the respective bit lines BL1 to BLm. Each of the cell strings includes a drain select transistor, a plurality of memory cells coupled in series to each other, and a source select transistor. The drain select transistors of the cell strings are coupled in common to a drain select line DSL. Memory cells disposed on each row line are coupled in common to a corresponding one of the first to n-th word lines WL1 to WLn. The source select transistors of the cell strings are coupled to a source select line SSL.

While a program pulse is applied to a selected word line, a program inhibit voltage may be applied to a bit line coupled to memory cells that are maintained in an erase state among the first to m-th bit lines BL1 to BLm. Furthermore, while a program pulse is applied to a selected word line, a program inhibit voltage may be applied to a bit line coupled to memory cells to be programmed among the first to m-th bit lines BL1 to BLm. As described with reference to FIGS. 8A to 8C, the memory cells that are maintained in the erase state may be maintained in the erase state E without a shift of threshold voltages thereof. To this end, a program inhibit voltage is applied to the bit line coupled to the corresponding memory cells so as to prevent the threshold voltages from being shifted. As described with reference to FIGS. 8A to 8C, the memory cells to be programmed may be memory cells to be programmed to any one of first to third program states PV1 to PV3. To this end, a program permission voltage may be applied to the bit line coupled to the memory cells to be programmed.

Referring to FIG. 12, the memory block 115 is coupled to first to m-th bit lines BL1 to BLm. The first to i-th bit lines BL1 to BLi among the first to m-th bit lines BL1 to BLm belong to the first group Group1. The i+1-th to m-th bit lines BL(i+1) to BLm among the first to m-th bit lines BL1 to BLm belong to the second group Group2. The bit lines BL1 to BLi included in the first group Group1 are disposed closer to the address decoder 120 than are the bit lines BL(i+1) to BLm included in the second group Group2. Therefore, a level of "first program permission voltage" which is a program permission voltage to be applied to a bit line coupled to memory cells to be programmed among the first to i-th bit lines BL1 to BLi is greater than a level of "second program permission voltage" which is a program permission voltage to be applied to a bit line coupled to memory cells to be programmed among the i+1-th to m-th bit lines BL(i+1) to BLm. The relationship between "first program permission voltage $V_{BLP1}$" and "second program permission voltage $V_{BLP2}$" may be expressed as the following equation 1.

$$V_{BLP1} = V_{BLP2} + \Delta V_{BL} \qquad \text{[Equation 1]}$$

Here, $\Delta V_{BL}$ may be a positive value and be selected as a value capable of minimizing a deviation in program speed between the memory cells. For example, $\Delta V_{BL}$ may be determined by experiments. For example, the second program permission voltage $V_{BLP2}$ may be a voltage having a level of 0 V or a ground voltage.

According to the relationship of Equation 1, a gate-channel voltage difference of a memory cell coupled to a bit line to which the first program permission voltage $V_{BLP1}$ is applied is less than a gate-channel voltage difference of a memory cell coupled to a bit line to which the second program permission voltage $V_{BLP2}$ is applied. Therefore, the overall program speed of the memory cell coupled to the bit line to which the first program permission voltage $V_{BLP1}$ is applied is reduced, while the overall program speed of the memory cell coupled to the bit line to which the second program permission voltage $V_{BLP2}$ is applied is maintained at a predetermined value. Consequently, the overall deviation in program speed between the memory cells may be reduced.

Meanwhile, a program inhibit voltage is applied to a bit line coupled to memory cells that are maintained in the erase state E among the first to m-th bit lines BL1 to BLm. For instance, the program inhibit voltage may be a power source voltage. Here, a channel region voltage of a cell string coupled to the bit line to which the program inhibit voltage is applied is increased. Thus, even when a program pulse is applied to a word line, a corresponding memory cell is not programmed.

In an embodiment, the operation of applying a program permission voltage having a relatively high level to the bit lines disposed adjacent to the address decoder 120 may correspond to only the blind program operation shown in FIGS. 9A and 9B. In this case, during the normal program operation, program permission voltages having the same level may be applied to the bit lines of the first group Group1 and the second group Group2.

In an embodiment, the operation of applying a program permission voltage having a relatively high level to the bit lines disposed adjacent to the address decoder 120 may be maintained not only during the blind program operation shown in FIGS. 9A and 9B but also during the normal program operation. In this case, even during the normal program operation, the first program permission voltage $V_{BLP1}$ may be applied to the bit lines of the first group Group1, and the second program permission voltage $V_{BLP1}$ may be applied to the bit lines of the second group Group2.

The grouping of the bit lines shown in FIGS. 11 and 12 is only an example, and the bit lines may be grouped in various other ways. Hereinafter, embodiments in which the bit lines are grouped into three or more groups will be described with reference to FIGS. 13 and 14.

Figure 13:
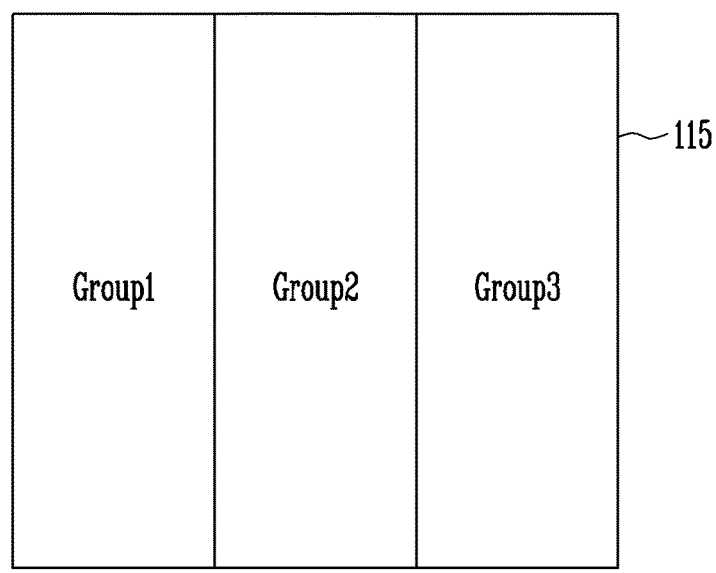
FIG. 13 is a schematic diagram illustrating a memory block to which three groups of bit lines are coupled, in accordance with an embodiment of the present disclosure.

FIG. 13 is a schematic diagram illustrating a memory block 115 to which three groups of bit lines are coupled. In FIG. 13, the bit lines coupled to the memory block 115 are divided into three groups Group1, Group2, and Group3. A first program permission voltage $V_{BLP1}$ is applied to a bit line coupled to a memory cell to be programmed among bit lines belonging to the first group Group1. A second program permission voltage $V_{BLP2}$ is applied to a bit line coupled to a memory cell to be programmed among bit lines belonging to the second group Group2. A third program permission voltage $V_{BLP3}$ is applied to a bit line coupled to a memory cell to be programmed among bit lines belonging to the third group Group3. A program inhibit voltage is applied to a bit line coupled to a memory cell that is maintained in an erase state among all of the bit lines belonging to the first to third groups Group1 to Group3.

In an embodiment of the present disclosure, the relationship between the first to third program permission voltages $V_{BLP1}$, $V_{BLP2}$, and $V_{BLP3}$ may be expressed as the following equations 2 and 3.

$$V_{BLP1} = V_{BLP2} + \Delta V_{BL1} \qquad \text{[Equation 2]}$$

$$V_{BLP2} = V_{BLP3} + \Delta V_{BL2} \qquad \text{[Equation 3]}$$

Here, $\Delta V_{BL1}$ and $\Delta V_{BL2}$ may be positive values and be selected as values capable of minimizing a deviation in program speed between the memory cells. In an embodiment, $\Delta V_{BL1}$ and $\Delta V_{BL2}$ may be the same value. In some embodiments, $\Delta V_{BL1}$ and $\Delta V_{BL2}$ may have different values.

Figure 14:
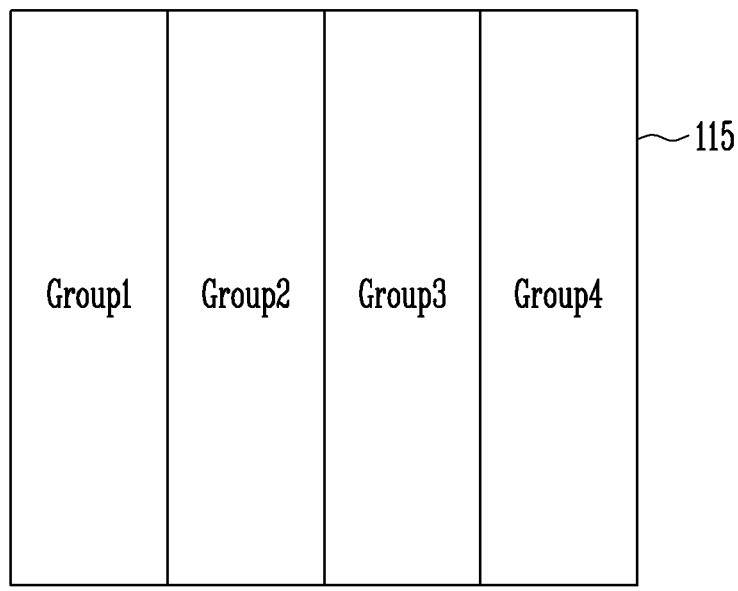
FIG. 14 is a schematic diagram illustrating a memory block to which four groups of bit lines are coupled, in accordance with an embodiment of the present disclosure.

FIG. 14 is a schematic diagram illustrating a memory block 115 to which four groups of bit lines are coupled. In FIG. 14, the bit lines coupled to the memory block 115 are divided into four groups Group1, Group2, Group3, and Group4. A first program permission voltage $V_{BLP1}$ is applied to a bit line coupled to a memory cell to be programmed among bit lines belonging to the first group Group1. A second program permission voltage $V_{BLP2}$ is applied to a bit line coupled to a memory cell to be programmed among bit lines belonging to the second group Group2. A third program permission voltage $V_{BLP3}$ is applied to a bit line coupled to a memory cell to be programmed among bit lines belonging to the third group Group3. A fourth program permission voltage $V_{BLP4}$ is applied to a bit line coupled to a memory cell to be programmed among bit lines belonging to the fourth group Group4. A program inhibit voltage is applied to a bit line coupled to a memory cell that is maintained in an erase state among all of the bit lines belonging to the first to fourth groups Group1 to Group4.

The embodiment of FIG. 14 is the same as the embodiment of FIG. 13, except that there is a difference in the number of bit line groups; therefore, repetitive explanations will be omitted.

As shown in FIGS. 11, 13, and 14, the number of bit line groups may be changed in various ways. In addition to the examples described above, the number of bit line groups may be five or more.

Figure 15:
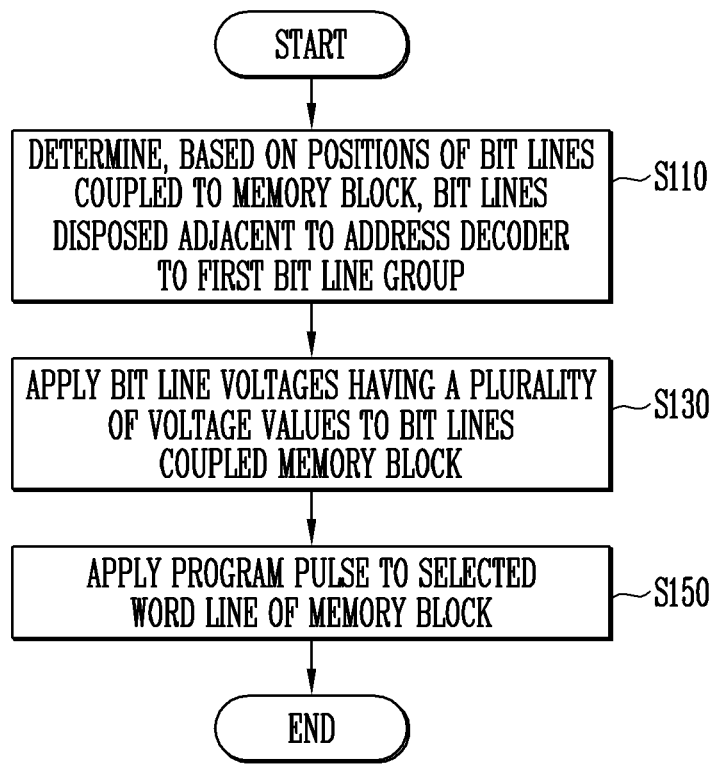
FIG. 15 is a flowchart illustrating a method of operating a semiconductor memory device in accordance with an embodiment of the present disclosure.

FIG. 15 is a flowchart illustrating a method of operating a semiconductor memory device in accordance with an embodiment of the present disclosure.

Referring to FIG. 15, the method of operating the semiconductor memory device in accordance with an embodiment includes: step S110 of determining bit lines disposed adjacent to the address decoder to a first bit line group, based on positions of bit lines coupled to a memory block; step S130 of applying bit line voltages having a plurality of voltage values to the bit lines coupled to the memory block; and step S150 of applying a program pulse to a selected word line of the memory block. Hereinafter, each step will be described in more detail.

At step S110, as shown in FIG. 11, the bit lines that are disposed adjacent to the address decoder 120 are determined to the first bit line group Group1. For example, the control logic 140 may determine bit lines to be included in the first bit line group Group1, based on data stored in a specific region in the memory cell array 110. In this case, a manufacturer who produces the semiconductor memory device 110 may determine a bit line to be included in the first bit line group Group1 and store corresponding data to the specific region in the memory cell array 110.

At step S130, bit line voltages having a plurality of voltage values are applied to the bit lines coupled to the memory block. At step S130, a program inhibit voltage may be applied to a bit line coupled to memory cells that are maintained in the erase state among the bit lines coupled to the memory block. On the other hand, a program permission voltage may be applied to a bit line coupled to memory cells to be programmed among the bit lines coupled to the memory block. Step S130 will be described with reference to FIG. 16.

At step S150, a program pulse is applied to a selected word line of the memory block. Thereby, the threshold voltage of a corresponding memory cell coupled to the bit line to which the program permission voltage is applied is shifted. On the other hand, the threshold voltage of a corresponding memory cell coupled to the bit line to which the program inhibit voltage is applied is not shifted.

In FIG. 15, there is illustrated an example in which step S150 is performed after step S130, but two steps S130 and S150 may be substantially performed at the same time.

Step S130 and step S150 of FIG. 15 may form a single program loop. Furthermore, after step S150 of FIG. 15 has been completed, the program operation may continue by repeatedly performing step S130 and step S150. In this case, the program operation may proceed in the manner shown in FIGS. 9A and 9B. Particularly, step S130 and step S150 may form the blind program operation shown in FIGS. 9A and 9B. In this case, a verify operation may not be performed while step S130 and step S150 are repeated.

Figure 16:
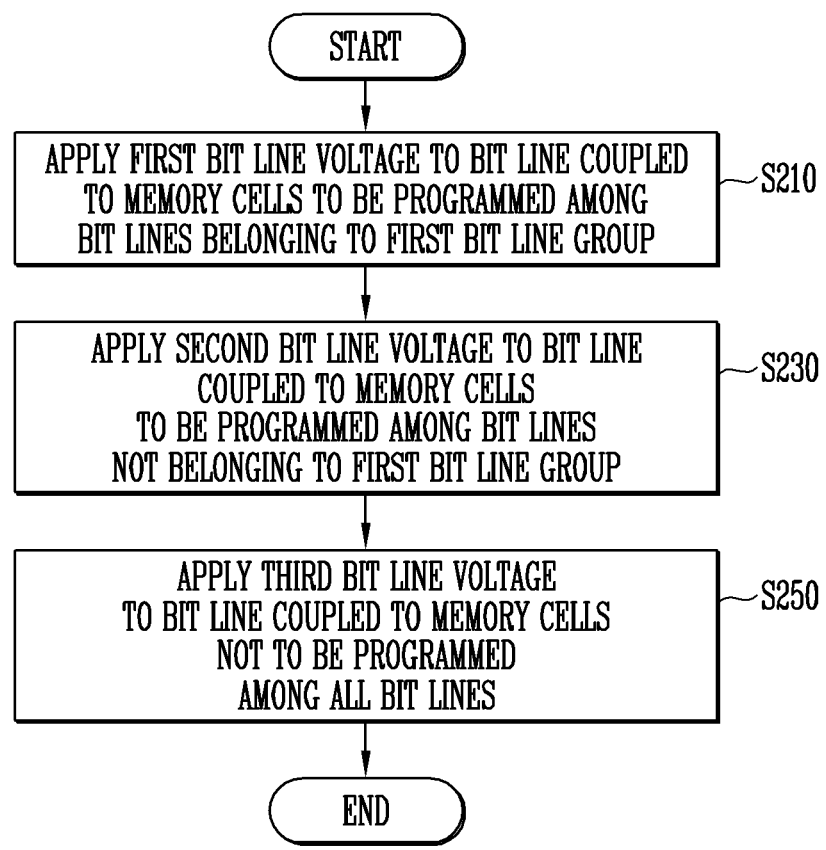
FIG. 16 is a flowchart illustrating in detail a bit line voltage application step of FIG. 15.

FIG. 16 is a flowchart illustrating in detail the bit line voltage application step of FIG. 15.

Referring to FIG. 16, step S130 of FIG. 15 includes: step S210 of applying a first bit line voltage to a bit line coupled to memory cells to be programmed among the bit lines belonging to the first bit line group; step S230 of applying a second bit line voltage to a bit line coupled to memory cells to be programmed among the bit lines that do not belong to the first bit line group; step S250 of applying a third bit line voltage to a bit line coupled to memory cells not to be programmed among all of the bit lines. Hereinafter, each step will be described in more detail.

At step S210, the first bit line voltage is applied to the bit lines coupled to the memory cells to be programmed among the bit lines belonging to the first group Group1. In other words, the first bit line group of step S210 may be the first group Group1 shown in FIGS. 11 and 12. The first bit line voltage may be the first program permission voltage $V_{BLP1}$ described above. At step S230, the second bit line voltage is applied to the bit lines coupled to the memory cell to be programmed among the bit lines of the second group Group1 that do not belong to the first group Group1. The second bit line voltage may be the second program permission voltage $V_{BLP2}$ described above. At step S250, the third bit line voltage is applied to the bit line coupled to the memory cells to be maintained in the erase state and not to b programmed among all of the bit lines coupled to the memory block. The third bit line voltage may be a program inhibit voltage.

In FIG. 16, there is illustrated an example in which step S230 is performed after step S210, and step S250 is performed after step S230. However, three steps S210, S230, and S250 may be substantially performed at the same time.

As described above, in the method of operating the semiconductor memory device in accordance with an embodiment of the present disclosure, a relatively high program permission voltage is applied to bit lines disposed adjacent to the address decoder 120 during the blind program period. Thereby, the deviation in program speed between memory cells to be programmed is reduced. Therefore, the period for which the blind program operation is performed may be increased. The number of program verify operations may be reduced. Therefore, the overall program speed of the semiconductor memory device may be enhanced.

Figure 17:
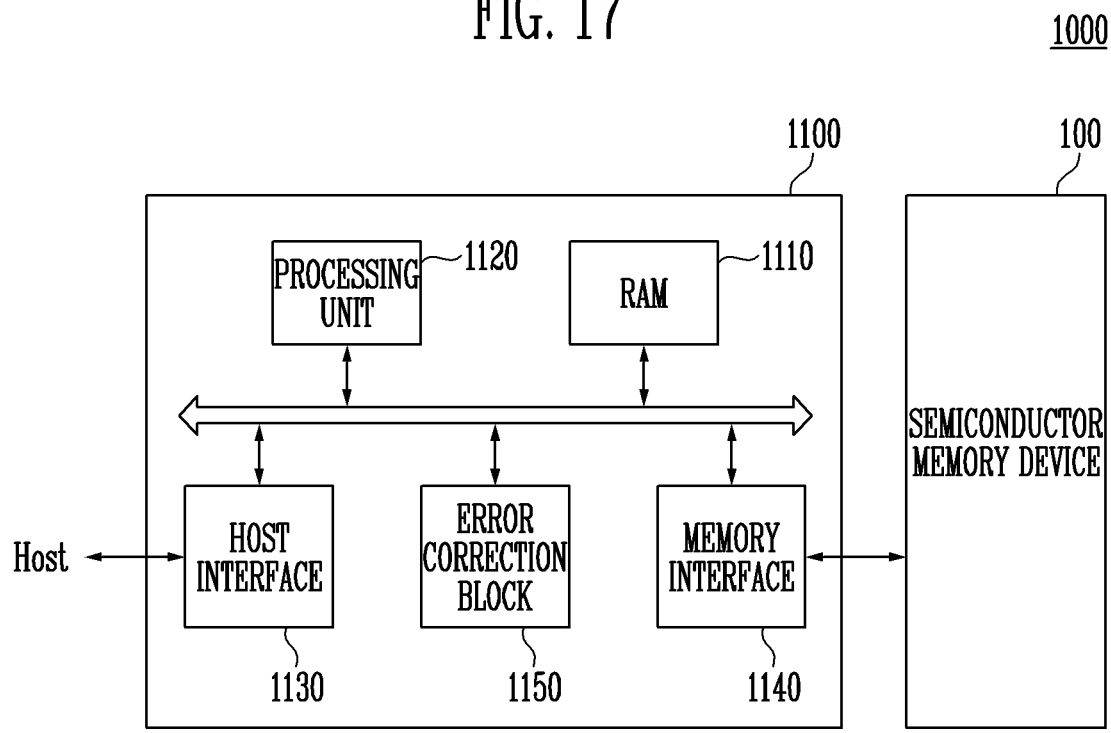
FIG. 17 is a block diagram illustrating a memory system including the semiconductor memory device of FIG. 1.

FIG. 17 is a block diagram illustrating a memory system 1000 including the semiconductor memory device 100 of FIG. 1.

Referring FIG. 17, a memory system 1000 may include a semiconductor memory device 100 and a controller 1100. The semiconductor memory device 100 may have the same configuration and operation as those of the semiconductor memory device described with reference to FIG. 1. Hereinafter, repetitive explanations will be omitted.

The controller 1100 is coupled to a host Host and the semiconductor memory device 100. The controller 1100 may access the semiconductor memory device 100 in response to a request from the host Host. For example, the controller 1100 may control a read operation, a write operation, an erase operation, and a background operation of the semiconductor memory device 100. The controller 1100 may provide an interface between the host Host and the semiconductor memory device 100. The controller 1100 may drive firmware for controlling the semiconductor memory device 100.

The controller 1100 may include a random access memory (RAM) 1110, a processing unit 1120, a host interface 1130, a memory interface 1140, and an error correction block 1150. The RAM 1110 may be used as at least one of an operating memory for the processing unit 1120, a cache memory between the semiconductor memory device 100 and the host Host, and a buffer memory between the semiconductor memory device 100 and the host Host. The processing unit 1120 may control the overall operation of the controller 1100. In addition, the controller 1100 may temporarily store program data provided from the host Host during the write operation.

The host interface 1130 may include a protocol for performing data exchange between the host Host and the controller 1100. In an embodiment, the controller 1100 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1140 may interface with the semiconductor memory device 100. For example, the memory interface may include a NAND interface or a NOR interface.

The error correcting block 1150 may use an error correcting code (ECC) to detect and correct an error in data received from the semiconductor memory device 100. The processing unit 1120 may adjust the read voltage according to an error detection result from the error correction block 1150, and control the semiconductor memory device 100 to perform re-reading. In an embodiment, the error correction block may be provided as an element of the controller 1100.

The controller 1100 and the semiconductor memory device 100 may be integrated into a single semiconductor device. In an embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick multimedia card (MMC, RS-MMC, or MMC-micro), a SD card (SD, miniSD, microSD, or SDHC), and a universal flash storage (UFS).

The controller 1100 and the semiconductor memory device 100 may be integrated into a single semiconductor device to form a solid state drive (SSD). The SSD may include a storage device configured to store data to a semiconductor memory. When the memory system 1000 is used as the SSD, the operating speed of the host Host coupled to the memory system 2000 may be phenomenally improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in various types of packages. For example, the semiconductor memory device 100 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

Figure 18:
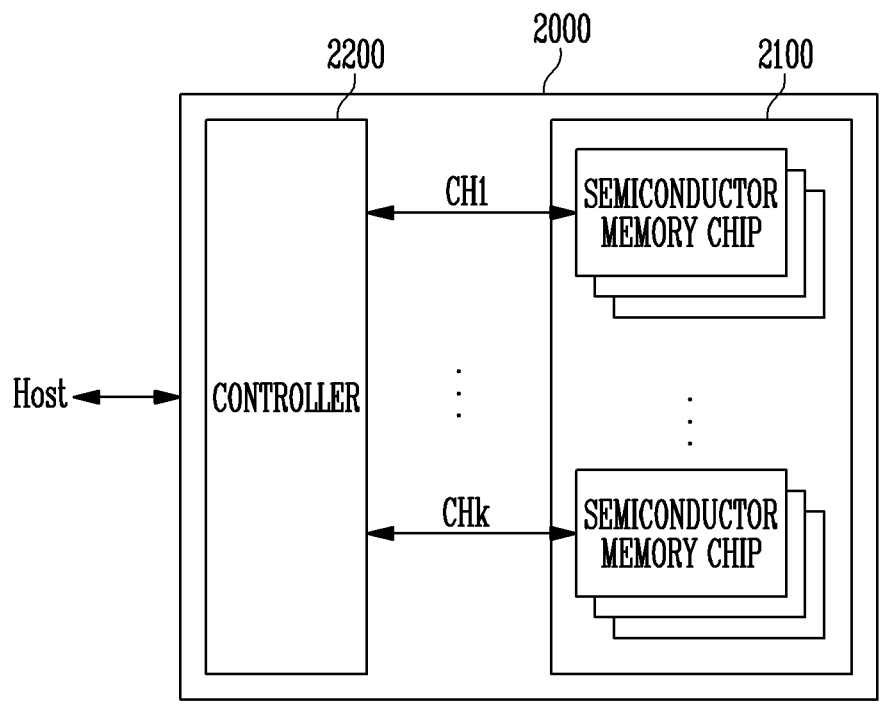
FIG. 18 is a block diagram illustrating an example of application of the memory system of FIG. 17.

FIG. 18 is a block diagram illustrating an example of application of the memory system of FIG. 17.

Referring FIG. 18, a memory system 2000 may include a semiconductor memory device 2100 and a controller 2200. The semiconductor memory device 2100 may include a plurality of semiconductor memory chips. The semiconductor memory chips are divided into a plurality of groups.

In FIG. 18, it is illustrated that the respective groups communicate with the controller 2200 through first to k-th channels CH1 to CHk. Each semiconductor memory chip may have the same configuration and operation as those of an embodiment of the semiconductor memory device 100 described with reference to FIG. 1.

Each group may communicate with the controller 2200 through one common channel. The controller 2200 has the same configuration as that of the controller 1100 described with reference to FIG. 17 and is configured to control a plurality of memory chips of the semiconductor memory device 2100 through the plurality of channels CH1 to CHk.

Figure 19:
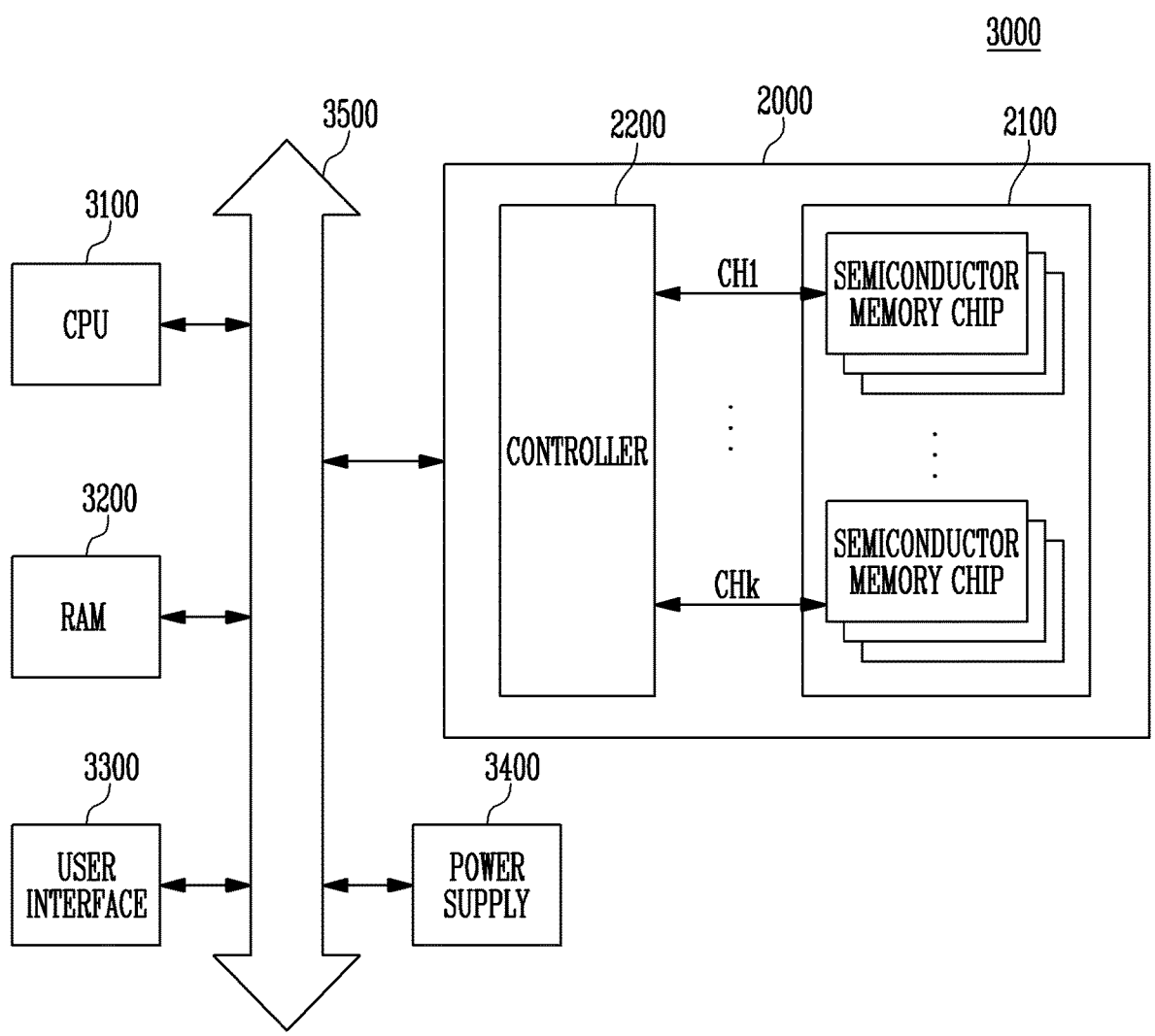
FIG. 19 is a block diagram illustrating a computing system including the memory system described with reference to FIG. 18.

FIG. 19 is a block diagram illustrating a computing system 3000 including the memory system 2000 described with reference to FIG. 18.

The computing system 3000 may include a central processing unit (CPU) 3100, a RAM 3200, a user interface 3300, a power supply 3400, a system bus 3500, and a memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 19, the semiconductor memory device 2100 has been illustrated as being coupled to the system bus 3500 through the controller 2200. Furthermore, the semiconductor memory device 2100 may be directly coupled to the system bus 3500. The function of the controller 2200 may be performed by the CPU 3100 and the RAM 3200.

In FIG. 19, it is illustrated that the memory system 2000 described with reference to FIG. 18 is provided. In an embodiment, the memory system 1000 described with reference to FIG. 17 may be replaced with the memory system 2000. In an embodiment, the computing system 3000 may be formed of both the memory systems 1000 and 2000 described with reference to FIGS. 17 and 18.

Various embodiments of the present disclosure may provide a semiconductor memory device having an improved operating speed.

Various embodiments of the present disclosure may provide an operating method capable of improving an operating speed of a semiconductor memory device.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
a memory cell array including a plurality of memory blocks;
a peripheral circuit configured to perform a program operation on a selected memory block among the plurality of memory blocks; and
a control logic configured to control the program operation of the peripheral circuit,
wherein the selected memory block is coupled with a plurality of bit lines, and the plurality of bit lines are grouped into a first bit line group and a second bit line group based on program speeds of each memory cell coupled to the plurality of bit lines that are grouped into the first bit line group and the second bit line group, and
wherein, during a blind program operation of the selected memory block, the control logic controls the peripheral circuit to apply, as a program permission voltage, a first bit line voltage to bit lines belonging to the first bit line group, and apply, as a program permission voltage, a second bit line voltage having a level different from a level of the first bit line voltage to bit lines belonging to the second bit line group.

2. The semiconductor memory device according to claim 1, wherein the program speeds of each memory cell are dependent on positions of the memory cells coupled to the bit lines included in the first and second bit line groups.

3. The semiconductor memory device according to claim 2,
wherein the peripheral circuit comprises an address decoder,
wherein the first bit line group is formed of bit lines disposed relatively adjacent to the address decoder as compared to bit lines of the second bit line group, and
wherein the second bit line group is formed of the bit lines disposed relatively distant from the address decoder as compared to the bit lines of the first bit line group.

4. The semiconductor memory device according to claim 3, wherein the level of the first bit line voltage is greater than the level of the second bit line voltage.

5. The semiconductor memory device according to claim 4, wherein the second bit line voltage is a ground voltage.

6. A semiconductor memory device comprising:
a memory cell array including at least one memory block coupled with a plurality of bit lines;
a peripheral circuit configured to perform a program operation on a plurality of memory cells included in the memory block; and
a control logic configured to control, during a blind program period, the peripheral circuit to apply different program permission voltages determined based on program speeds of the plurality of memory cells, to bit lines coupled to memory cells to be programmed among the plurality of memory cells.

7. The semiconductor memory device according to claim 6, wherein the program speeds of each memory cell in the plurality of memory cells are dependent on positions of the bit lines coupled to the memory cells, respectively, to be programmed among the plurality of memory cells.

8. The semiconductor memory device according to claim 7, wherein, during the blind program period, the control logic controls the peripheral circuit not to perform a verify operation on the plurality of memory cells.

9. The semiconductor memory device according to claim 8,
wherein the peripheral circuit comprises an address decoder, and
wherein the plurality of bit lines are grouped into a first bit line group disposed relatively adjacent to the address decoder as compared to a second bit line group whereby a second bit line group is disposed relatively distant from the address decoder as compared to the first bit line group.

10. The semiconductor memory device according to claim 9, wherein the control logic controls the peripheral circuit such that:
a first bit line voltage is applied to bit lines coupled to memory cells to be programmed among the bit lines of the first bit line group;
a second bit line voltage is applied to bit lines coupled to memory cells to be programmed among the bit lines of the second bit line group; and
a program inhibit voltage is applied to bit lines coupled to memory cells not to be programmed among the bit lines.

11. A method of operating a semiconductor memory device, comprising:
determining, based on positions of bit lines coupled to a memory block selected as a target to be programmed, bit lines disposed adjacent to an address decoder to a first bit line group;
applying, during a blind program period, a first bit line voltage to a bit line coupled to memory cells to be programmed among the bit lines belonging to the first bit line group, applying a second bit line voltage to a bit line coupled to memory cells to be programmed among bit lines not belonging to the first bit line group, and applying a third bit line voltage to a bit line coupled to memory cells not to be programmed; and
applying a program pulse to a selected word line of the memory block.

12. The method according to claim 11, wherein a level of the first bit line voltage is greater than a level of the second bit line voltage.

13. The method according to claim 12, wherein the third bit line voltage is a program inhibit voltage.

14. The method according to claim 12, wherein the second bit line voltage is a ground voltage.

15. A method of operating a semiconductor memory device, comprising:
providing a first deviation in program speeds between a plurality of memory cells included in a memory block;
grouping a second plurality of memory cells from the plurality of memory cells to provide a second deviation in program speeds between memory cells in the second plurality of memory cells;
grouping a third plurality of memory cells from the plurality of memory cells to provide a third deviation in program speeds between memory cells in the third plurality of memory cells;
applying a first program permission voltage, during a blind program operation of a program operation of the memory block, as a first bit line voltage to bit lines coupled with the second plurality of memory cells; and
applying a second program permission voltage, during the blind program operation of the program operation of the memory block, as a second bit line voltage to bit lines coupled with the third plurality of memory cells,
wherein a level of the first bit line voltage is different from a level of the second bit line voltage.

16. The method according to claim 15, wherein the levels of the first and second bit line voltages are set to minimize a number of verify operations performed in the program operation of the memory block.

17. The method according to claim 15, wherein the first and second bit line voltages are determined based on the program speeds of the second and third plurality of memory cells.

18. The method according to claim 15, wherein the first and second bit line voltages are determined based on positions of the bit lines.

19. The method according to claim 15,
wherein the first deviation in program speeds between the plurality of memory cells is greater than the second deviation in program speeds between the memory cells in the second plurality of memory cells, and
wherein the first deviation in program speeds between the plurality of memory cells is greater than the third deviation in program speeds between the memory cells in the third plurality of memory cells.

\* \* \* \* \*